United States Patent
Shimizu

(10) Patent No.: US 9,893,153 B2
(45) Date of Patent: Feb. 13, 2018

(54) SEMICONDUCTOR DEVICE AND METHOD OF MANUFACTURING THE SAME

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/813,619

(22) Filed: Jul. 30, 2015

(65) Prior Publication Data
US 2016/0087045 A1 Mar. 24, 2016

(30) Foreign Application Priority Data
Sep. 19, 2014 (JP) .................................. 2014-190929

(51) Int. Cl.
*H01L 31/0256* (2006.01)
*H01L 29/735* (2006.01)
(Continued)

(52) U.S. Cl.
CPC ........ *H01L 29/1608* (2013.01); *H01L 21/049* (2013.01); *H01L 21/28158* (2013.01);
(Continued)

(58) Field of Classification Search
CPC . H01L 29/1608; H01L 29/167; H01L 29/105; H01L 29/7813; H01L 29/7802;
(Continued)

(56) References Cited

U.S. PATENT DOCUMENTS 6,027,977 A * 2/2000 Mogami .......... H01L 21/28185
257/E21.143
2006/0194379 A1 8/2006 Suda et al.
(Continued)

FOREIGN PATENT DOCUMENTS

EP 1 662 558 A1 5/2006
EP 2 471 981 A1 7/2012
(Continued)

OTHER PUBLICATIONS

U.S. Appl. No. 14/751,567, filed Jun. 26, 2015, Tatsuo Shimizu.
(Continued)

*Primary Examiner* — Su C Kim
(74) *Attorney, Agent, or Firm* — Oblon, McClelland, Maier & Neustadt, L.L.P.

(57) ABSTRACT

A semiconductor device according to an embodiment includes a SiC layer, a gate electrode, a gate insulating film provided between the SiC layer and the gate electrode, a first region provided between the SiC layer and the gate insulating film, and a second region provided in the SiC layer. The first region contains at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine). The second region provided adjacent to the first region, and the second region has a higher oxygen concentration than a concentration of the at least one element.

19 Claims, 12 Drawing Sheets

(51) Int. Cl.
  *H01L 29/16* (2006.01)
  *H01L 21/04* (2006.01)
  *H01L 29/66* (2006.01)
  *H01L 21/28* (2006.01)
  *H01L 21/321* (2006.01)
  *H01L 21/324* (2006.01)
  *H01L 29/51* (2006.01)
  *H01L 29/739* (2006.01)
  *H01L 29/78* (2006.01)
  *H01L 29/10* (2006.01)
  *H01L 29/167* (2006.01)
  *H01L 21/265* (2006.01)
  *H01L 29/04* (2006.01)

(52) U.S. Cl.
  CPC ........ *H01L 21/324* (2013.01); *H01L 21/3211* (2013.01); *H01L 29/105* (2013.01); *H01L 29/167* (2013.01); *H01L 29/517* (2013.01); *H01L 29/66068* (2013.01); *H01L 29/7395* (2013.01); *H01L 29/7802* (2013.01); *H01L 29/7813* (2013.01); *H01L 21/265* (2013.01); *H01L 29/045* (2013.01)

(58) Field of Classification Search
  CPC ............... H01L 29/7395; H01L 21/324; H01L 21/3211; H01L 21/28158; H01L 29/517; H01L 21/049; H01L 29/66068; H01L 29/045; H01L 21/265
  See application file for complete search history.

(56) References Cited

U.S. PATENT DOCUMENTS

| | | | | |
|---|---|---|---|---|
| 2011/0057202 | A1* | 3/2011 | Kono | H01L 29/0619 257/77 |
| 2011/0140243 | A1* | 6/2011 | Misumi | H01L 21/263 257/617 |
| 2011/0284848 | A1* | 11/2011 | Yamazaki | H01L 27/1225 257/57 |
| 2012/0199846 | A1 | 8/2012 | Shimizu et al. | |
| 2012/0211769 | A1 | 8/2012 | Kusunoki et al. | |
| 2012/0241767 | A1 | 9/2012 | Yano et al. | |
| 2013/0187152 | A1* | 7/2013 | Yamazaki | H01L 29/78693 257/43 |
| 2013/0234163 | A1* | 9/2013 | Hamamura | H01L 29/513 257/77 |
| 2016/0087043 | A1 | 3/2016 | Shimizu et al. | |

FOREIGN PATENT DOCUMENTS

| | | |
|---|---|---|
| EP | 2 515 336 A1 | 10/2012 |
| JP | 2005-136386 A | 5/2005 |
| JP | 2005-136386 A | 5/2005 |
| JP | 2008-243919 A | 10/2008 |
| JP | 2011-82454 A | 4/2011 |
| JP | 2012-164788 | 8/2012 |
| JP | 2013-8894 A | 1/2013 |
| JP | 2014-67927 A | 4/2014 |
| JP | 2014-78727 | 5/2014 |
| JP | 2016-63110 A | 4/2016 |
| WO | WO 2005/010974 A1 | 2/2005 |
| WO | WO 2012/131898 A1 | 10/2012 |

OTHER PUBLICATIONS

U.S. Appl. No. 13/216,413, filed Aug. 24, 2011, Tatsuo Shimizu et al.

Koutarou Kawahara et al. "Detection and Depth Analyses of Deep Levels Generated by Ion Implantation in n- and p-Type 4HSiC", Journal of Applied Physics, vol. 106, No. 1, 2009, 7 pages.

Toru Hiyoshi et al. "Reduction of Deep Levels and Improvement of Carrier Lifetime in n-Type 4H-SiC by Thermal Oxidation", Applied Physics Express, vol. 2, 2009, 4 pages.

Extended Search Report dated Feb. 3, 2016 in European Patent Application No. 15176888.4.

Jisheng Han, et al., "SIMS Investigation of Oxygen in 3C-SiC on Si", Optoelectronic and Microelectronic Materials and Devices, COMMAD, IEEE 2008, XP031437646, pp. 20-22.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-190929, filed on Sep. 19, 2014, the entire contents of which are incorporated herein by reference.

FIELD

Embodiments described herein relate generally to a semiconductor device and a method for manufacturing the same.

BACKGROUND

SiC (silicon carbide) is expected to be a material for next-generation semiconductor devices. SiC has excellent physical properties, having a band gap three times wider than that of Si (silicon), a breakdown field strength approximately 10 times higher than that of Si, and a heat conductivity approximately three times higher than that of Si. A semiconductor device that has low loss and is capable of high-temperature operation can be realized by taking advantage of those properties.

In a case where a MIS (Metal Insulator Semiconductor) structure is formed with SiC, however, the density of interface states or the like existing between the semiconductor and the insulating film is higher than that of Si. Therefore, the charge mobility becomes lower, and the on-state resistance of a MISFET (Metal Insulator Semiconductor Field Effect Transistor) or an IGBT (Insulated Gate Bipolar Transistor) becomes higher.

DETAILED DESCRIPTION

Figure 1:
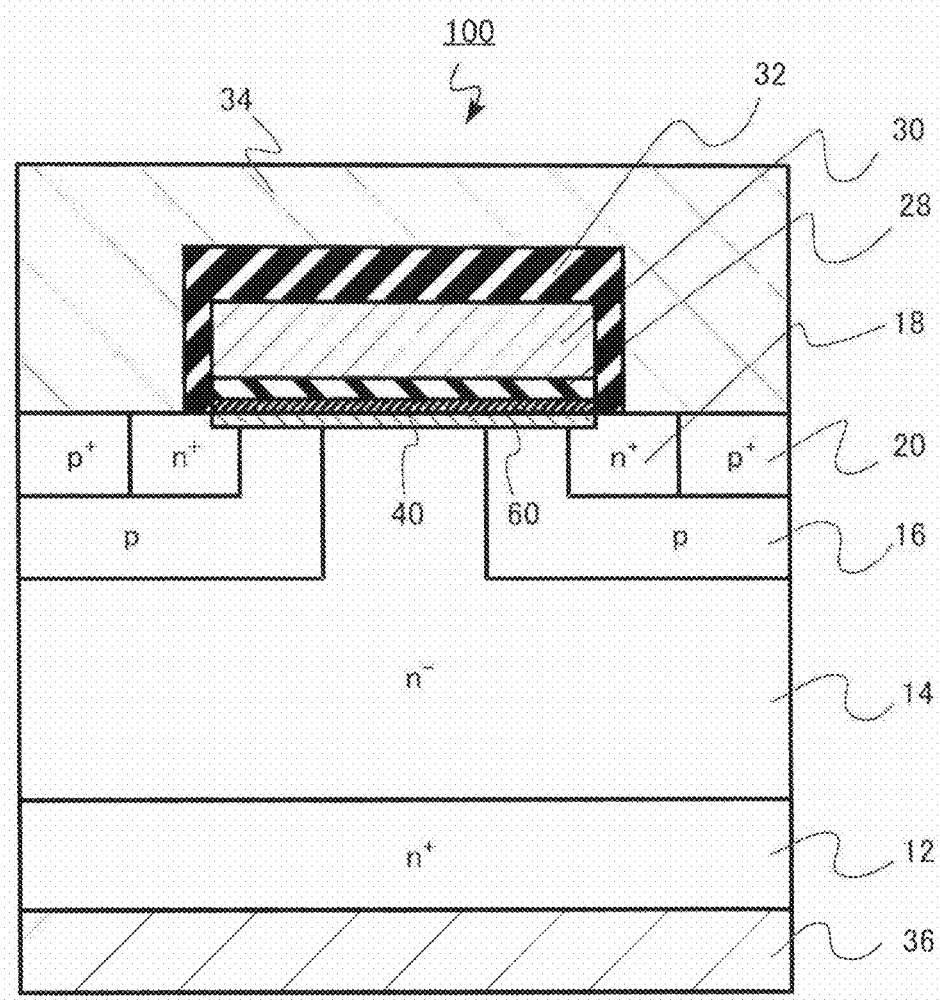
FIG. 1 is a schematic cross-sectional view of a semiconductor device according to a first embodiment.

A semiconductor device according to an embodiment includes: a SiC layer; a gate electrode; a gate insulating film provided between the SiC layer and the gate electrode; a first region provided between the SiC layer and the gate insulating film, the first region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine); and a second region provided in the SiC layer, the second region provided adjacent to the first region, the second region having a higher oxygen concentration than a concentration of the at least one element.

The following is a description of embodiments, with reference to the accompanying drawings. In the description below, same or similar components are denoted by same reference numerals, and explanation of components described once will not be repeated.

In the description below, $n^+$, n, $n^-$, $p^+$, p, and $p^-$ indicate relative levels of impurity concentrations in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where the $n^+$-type and the $n^-$-type are referred to simply as the n-type, and the $p^+$-type and the $p^-$-type are referred to simply as the p-type.

First Embodiment

A semiconductor device according to this embodiment includes: a SiC layer; a gate electrode; a gate insulating film provided between the SiC layer and the gate electrode; a first region (an interfacial region) provided between the SiC layer and the gate insulating film, the first region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine); and a second region (an oxygen region) provided on the first region side of the SiC layer, the second region having a higher oxygen concentration than the concentration of the element.

In the description below, the element contained in the interfacial region (first region) is called the termination element for convenience sake.

FIG. 1 is a schematic cross-sectional view showing the structure of a MISFET that is the semiconductor device according to this embodiment. The MISFET 100 is a Double Implantation MOSFET (DIMOSFET) in which the p-wells and the source regions are formed by ion implantation.

This MISFET 100 includes an n$^+$-type SiC substrate 12 having first and second planes. In FIG. 1, the first plane is the upper surface, and the second plane is the lower surface.

This SiC substrate 12 is a 4H-SiC SiC substrate containing N (nitrogen), for example, as the n-type impurity at an impurity concentration not lower than $1 \times 10^{18}$ cm$^{-3}$ and not higher than $1 \times 10^{20}$ cm$^{-3}$, for example.

Figure 2:
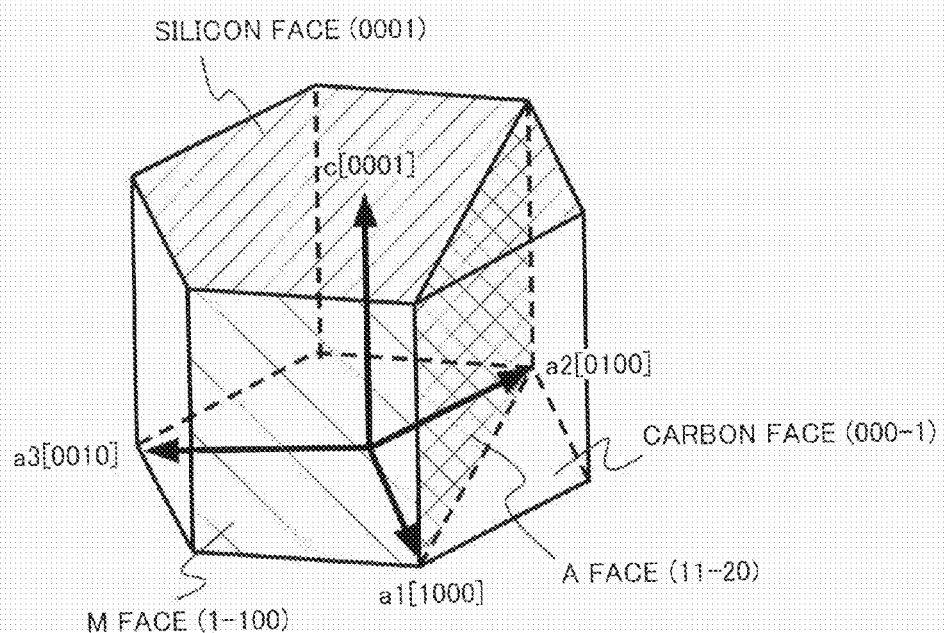
FIG. 2 is a diagram showing a crystalline structure of a SiC semiconductor according to the first embodiment.

FIG. 2 is a diagram showing a crystalline structure of a SiC semiconductor. A typical crystalline structure of a SiC semiconductor is a hexagonal crystal system such as 4H-SiC. One of the faces (the top surfaces of a hexagonal prism) having the c-axis extending in the axial direction of the hexagonal prism as the normal line is the (0001) face. The face equivalent to the (0001) face is referred to as the silicon face and is written as the {0001} face. Si (silicon) is arranged in the silicon face.

The other one of the surfaces (the top surfaces of the hexagonal prism) having the c-axis extending in the axial direction of the hexagonal prism as the normal line is the (000-1) face. The face equivalent to the (000-1) face is referred to as the carbon face and is written as the {000-1} face. C (carbon) is arranged in the carbon face.

Meanwhile, a side surface (prismatic surface) of the hexagonal prism is an M face equivalent to the (1-100) face, or is the {1-100} face. The face extending along edge lines that are not adjacent to each other is an A face equivalent to the (11-20) face, or is the {11-20} face. Both Si (silicon) and C (carbon) are arranged in the M face and the A face.

The description below concerns an example case where the first plane of the SiC substrate 12 is a plane tilted zero to eight degrees with respect to the silicon face, and the second plane is a plane tilted zero to eight degrees with respect to the carbon face. The plane tilted zero to eight degrees with respect to the silicon face, and the plane tilted zero to eight degrees with respect to the carbon face can be regarded substantially equivalent to the silicon face and the carbon face, respectively, in terms of characteristics.

An n$^-$-type drift layer 14 containing the n-type impurity at an impurity concentration not lower than $5 \times 10^{15}$ cm$^{-3}$ and not higher than $2 \times 10^{16}$ cm$^{-3}$, for example, is formed on the first plane of the SiC substrate 12. The drift layer 14 is a SiC epitaxially grown layer formed on the SiC substrate 12 by epitaxial growth, for example.

The surface of the drift layer 14 is also a plane tilted zero to eight degrees with respect to the silicon face. The thickness of the drift layer 14 is not smaller than 5 μm and not greater than 150 μm, for example.

P-type p-well regions 16 containing the p-type impurity at an impurity concentration not lower than $5 \times 10^{15}$ cm$^{-3}$ and not higher than $1 \times 10^{17}$ cm$^{-3}$, for example, are formed in part of the surface of the drift layer 14. The depth of the p-well regions 16 is approximately 0.6 μm, for example. The p-well regions 16 function as channel regions of the MISFET 100.

N$^+$-type source regions 18 containing the n-type impurity at an impurity concentration not lower than approximately $1 \times 10^{18}$ cm$^{-3}$ and not higher than approximately $1 \times 10^{22}$ cm$^{-3}$, for example, are formed in part of the surfaces of the p-well regions 16. The depth of the source regions 18 is smaller than the depth of the p-well regions 16, and is approximately 0.3 μm, for example.

P$^+$-type p-well contact regions 20 containing the p-type impurity at an impurity concentration not lower than $1 \times 10^{18}$ cm$^{-3}$ and not higher than $1 \times 10^{22}$ cm$^{-3}$, for example, are formed in part of the surfaces of the p-well regions 16 and on the sides of the source regions 18. The depth of the p-well contact regions 20 is smaller than the depth of the p-well regions 16, and is approximately 0.3 μm, for example.

A gate insulating film 28 is continuously formed on the surfaces of the drift layer 14 and the p-well regions 16, so as to bridge the layer and the regions. The gate insulating film 28 may be a silicon oxide film, a silicon oxynitride film, or a high-k insulating film, for example. So as to reduce current leakage from the gate insulating film 28, it is preferable to use a silicon oxide film having a wider bandgap than a high-k insulating film.

If excess C (carbon) exists in the gate insulating film 28, there is a possibility that the density of trap levels that adversely affect device characteristics such as reliability will increase. Therefore, the concentration of C (carbon) in the gate insulating film 28 is preferably $1 \times 10^{18}$ cm$^{-3}$ or lower.

A gate electrode 30 is formed on the gate insulating film 28. The gate electrode 30 may be made of doped polysilicon, for example. An interlayer insulating film 32 formed with a silicon oxide film, for example, is formed on the gate electrode 30.

The gate insulating film 28 is provided between the gate electrode 30 and the p-well regions 16. An interfacial region (the first region) 40 is provided between the gate insulating film 28 and the p-well regions 16. The interfacial region 40 contains at least one element (termination element) selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine). In the interfacial region (first region) 40, the termination element substitutes for the carbon atoms or the silicon atoms in the surface of the SiC layer, to terminate the dangling bonds between the gate insulating film 28 and the SiC layers. Alternatively, the termination element binds directly to the dangling bonds, to terminate the dangling bonds.

An oxygen region (the second region) 60 is provided between the interfacial region 40 and the p-well regions 16. The oxygen region 60 has a higher oxygen concentration than the concentration of the termination element.

The oxygen region 60 is a SiC layer containing oxygen, and functions as a channel region of the MISFET 100. The oxygen region 60 has a structure in which one carbon atom in the SiC lattice is substituted by two oxygen atoms. Some carbon site in a SiC lattice is occupied by oxygen in the oxygen region 60. Having this structure, the oxygen region 60 has the carbon vacancy density of the SiC layer lowered.

Figure 3:
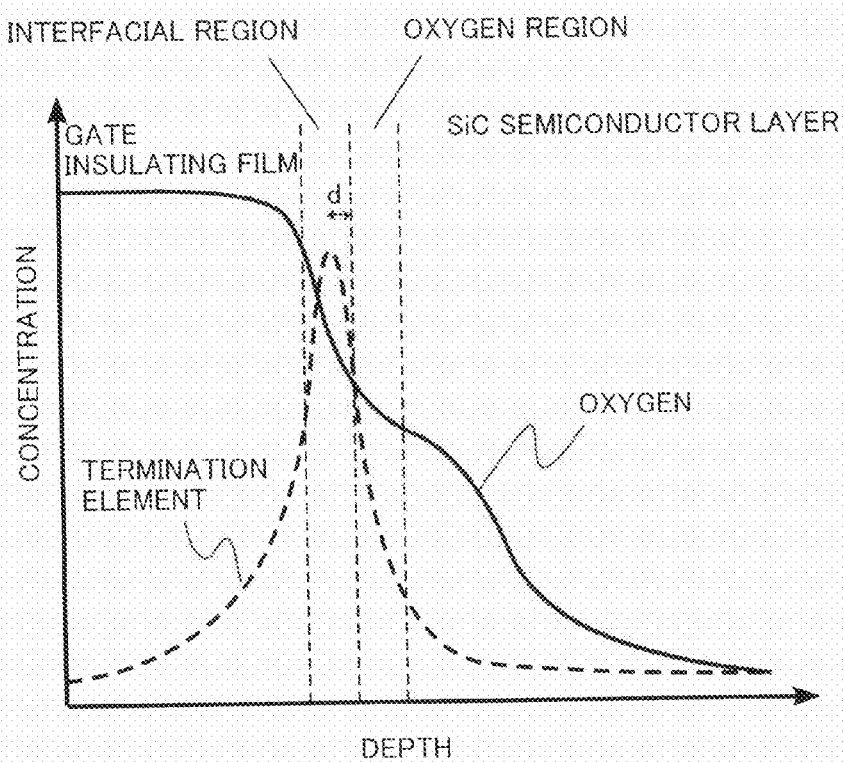
FIG. 3 is a diagram showing an elemental profile of the semiconductor device according to the first embodiment.

FIG. 3 is a diagram showing the elemental profiles of the semiconductor device according to this embodiment. This diagram shows the concentration profiles of the oxygen and the termination element in a cross-section including the p-well regions (SiC layers) 16 and the gate insulating film 28.

As shown in FIG. 3, the interfacial region 40 has the peak of the termination element concentration between the gate insulating film 28 and the p-well regions (SiC layers) 16. On the p-well region side of the interfacial region 40, there exists the oxygen region 60 having a higher oxygen concentration than the concentration of the termination element. The termination element is segregated in interfaces between the gate insulating film 28 and the p-well regions 16.

The MISFET 100 includes a conductive source electrode 34 electrically connected to the source regions 18 and the p-well contact regions 20. The source electrode 34 also functions as a p-well electrode to apply potential to the p-well regions 16.

The source electrode 34 is formed with a Ni (nickel) barrier metal layer and an Al (aluminum) metal layer stacked on the barrier metal layer, for example. The Ni barrier metal layer and the Al metal layer may form an alloy through a reaction.

A conductive drain electrode 36 is formed on the opposite side of the SiC substrate 12 from the drift layer 14, or on the second plane side of the SiC substrate 12. The drain electrode 36 is formed with a Ni (nickel) barrier metal layer and an Al (aluminum) metal layer stacked on the barrier metal layer, for example. The Ni barrier metal layer and the Al metal layer may form an alloy through a reaction.

In this embodiment, the n-type impurity is preferably N (nitrogen) or P (phosphorus), for example, but it is also possible to use As (arsenic), Sb (antimony), or the like. The p-type impurity is preferably Al (aluminum), for example, but it is also possible to use B (boron), Ga (gallium), In (indium), or the like.

Next, a semiconductor device manufacturing method according to this embodiment is described. A semiconductor device manufacturing method according to this embodiment includes: forming a thermally-oxidized film having a thickness of 5 nm or smaller on the surface of a SiC layer; forming an oxygen region containing oxygen on the SiC layer by performing a first heat treatment on the SiC layer in an oxygen-containing atmosphere under the condition that the amount of oxidized SiC is smaller than 1 nm; forming an interfacial region on the surface of the oxygen region after the formation of the oxygen region, the interfacial region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine); depositing a gate insulating film on the SiC layer; and forming a gate electrode on the gate insulating film. The semiconductor device manufacturing method according to this embodiment is an example of a method of manufacturing the semiconductor device shown in FIG. 1.

FIGS. 4 through 8 are schematic cross-sectional views of the semiconductor device being manufactured by the semiconductor device manufacturing method according to this embodiment.

First, the n$^+$-type SiC substrate 12 having the first plane as the silicon face and the second plane as the carbon face is prepared. The n$^-$-type drift layer 14 is formed on the first plane of the SiC substrate 12 by an epitaxial growth technique. The surface of the drift layer 14 is also a surface tilted zero to eight degrees with respect to the silicon face.

Figure 4:
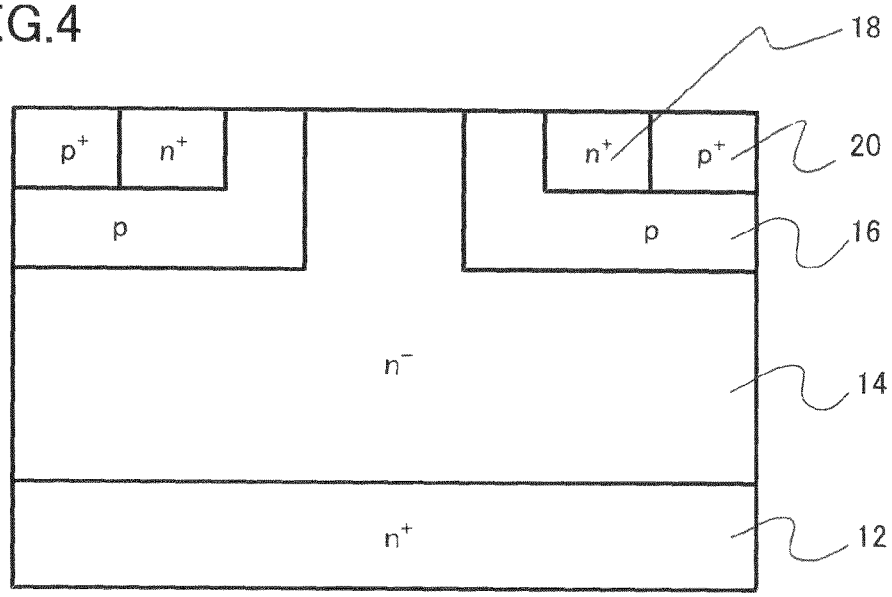
FIG. 4 is a schematic cross-sectional view of the semiconductor device being manufactured by a semiconductor device manufacturing method according to the first embodiment.

The p-type p-well regions (SiC layers) 16, the n$^+$-type source regions 18, and the p$^+$-type p-well contact regions 20 are then formed by a known photolithography technique and a known ion implantation technique (FIG. 4).

Figure 5:
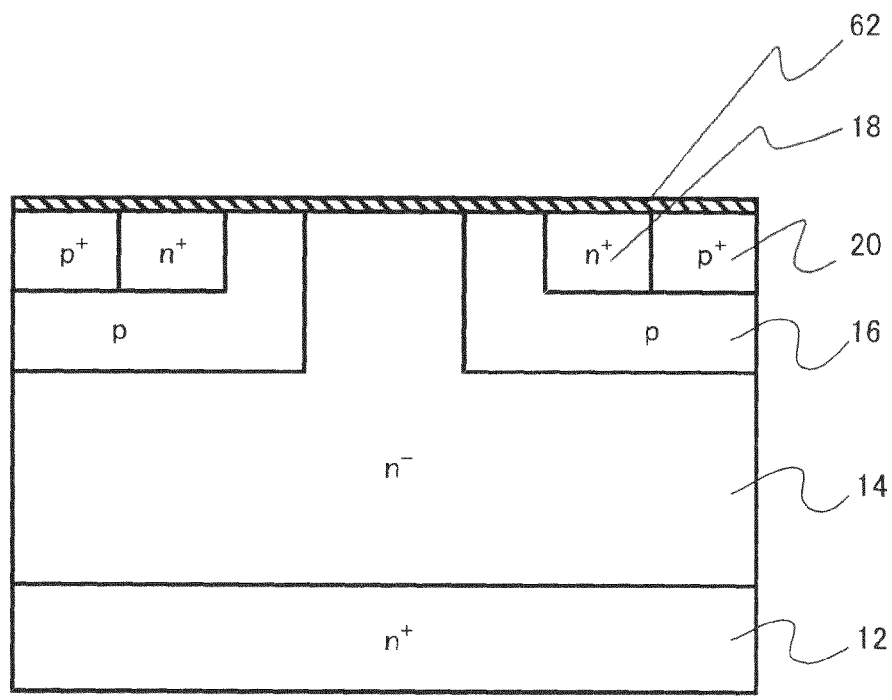
FIG. 5 is a schematic cross-sectional view of the semiconductor device being manufactured by the semiconductor device manufacturing method according to the first embodiment.

A thermally-oxidized film 62 having a thickness of 5 nm or smaller is then formed on the surfaces of the p-well regions (SiC layers) 16, the drift layer 14, the source regions 18, and the p-well contact regions 20 (FIG. 5). The thickness of the thermally-oxidized film 62 is preferably not smaller than 0.5 nm and not greater than 3 nm. More preferably, the thickness of the thermally-oxidized film 62 is approximately 1 nm. The thermally-oxidized film 62 is formed at a temperature not lower than 800° C. and not higher than 1300° C., for example. At this point, a large number of carbon defects appear in the vicinities of the interfaces.

In an oxygen-containing atmosphere, a first heat treatment is performed under the condition that the amount of oxidized SiC becomes smaller than 1 nm. A test SiC wafer is disposed in the heat treatment furnace at the time of a heat treatment, for example, so that the amount of oxidized SiC during the first heat treatment can be monitored.

Figure 6:
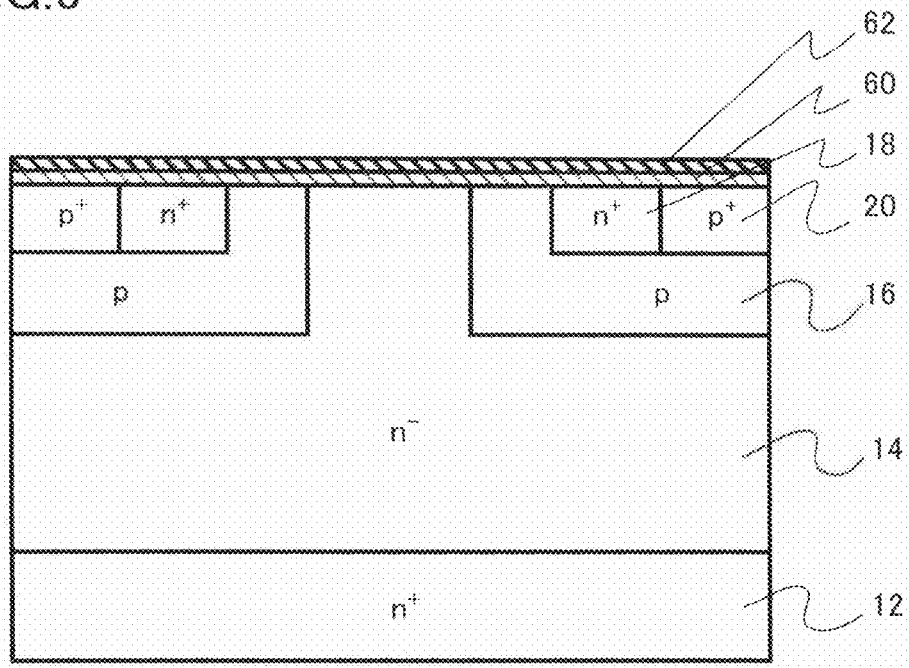
FIG. 6 is a schematic cross-sectional view of the semiconductor device being manufactured by the semiconductor device manufacturing method according to the first embodiment.

The oxygen region 60 is formed between the thermally-oxidized film 62 and the p-well regions 16. Through the first heat treatment, oxygen is diffused in the p-well regions (SiC layers) 16, and the oxygen region 60 is formed (FIG. 6).

The "condition that the amount of oxidized SiC becomes smaller than 1 nm" in the first heat treatment is a condition for not actually oxidizing SiC. The first heat treatment is preferably performed at a temperature not lower than 300° C. and not higher than 900° C. The upper limit of the temperature depends on face orientation. The temperature is specified so that the oxidized amount does not exceed 1 nm even if atmospheric dry oxidation is conducted for six hours or longer. The C face is preferably subjected to the first heat treatment at 800° C. or lower, the A face and the M face are preferably subjected to the first heat treatment at 850° C. or lower, and the Si face is preferably subjected to the first heat treatment at 900° C. or lower. The lower limit of the temperature is preferably high so as to facilitate diffusion. Therefore, the C face is preferably subjected to the first heat treatment at a temperature of 700° C. to 800° C., the A face and the M face are preferably subjected to the first heat treatment at a temperature not lower than 750° C. and not higher than 850° C., and the Si face is preferably subjected to the first heat treatment at a temperature not lower than 800° C. and not higher than 900° C. That is, the first heat treatment is preferably performed at approximately 800° C. in any face orientation.

Figure 7:
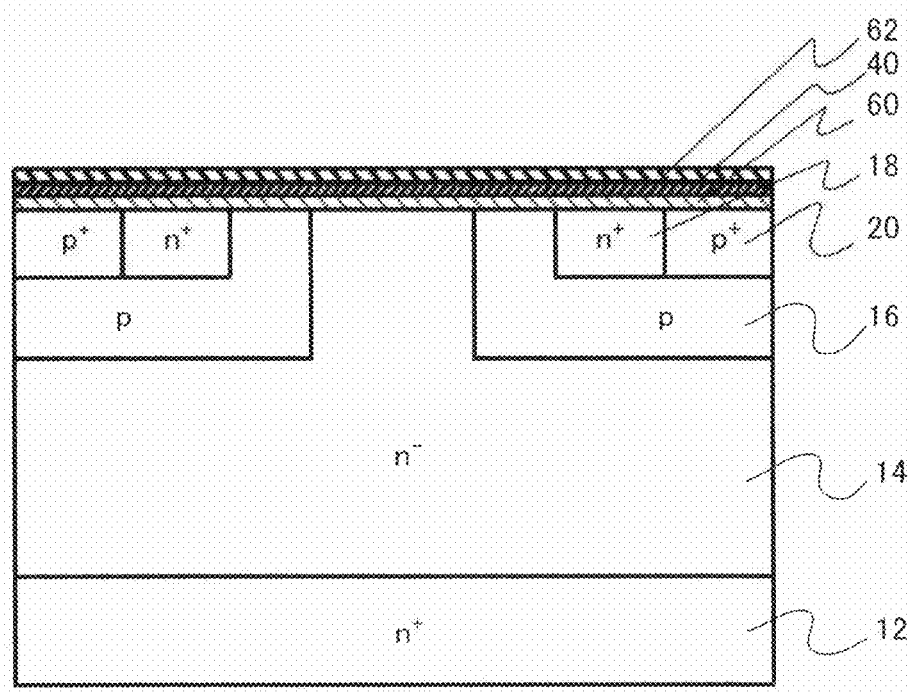
FIG. 7 is a schematic cross-sectional view of the semiconductor device being manufactured by the semiconductor device manufacturing method according to the first embodiment.

After the oxygen region 60 is formed, the interfacial region 40 containing at least one termination element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine) is formed on the surface of the oxygen region 60 (FIG. 7). The interfacial region 40 is formed between the oxygen region 60 and the thermally-oxidized film 62.

In a case where the termination element is N (nitrogen), for example, the surface of the oxygen region 60 is nitrided at a temperature not lower than 1250° C. and not higher than 1300° C., for example, in a NO atmosphere, so that the interfacial region 40 is formed. It is also possible to perform the nitriding in a N$_2$O atmosphere or a NH$_3$ atmosphere.

In a case where the termination element is P (phosphorus), As (arsenic), Sb (antimony), Sc (scandium), Y (yttrium), La (lanthanum), or one of the lanthanoids (Ce, Pr, Nd, Pm, Sm, Eu, Gd, Tb, Dy, Ho, Er, Tm, Yb, and Lu), for example, an oxide film of approximately 50 nm is deposited, for example, and termination element ions are implanted into the oxide film and are introduced into the interface between the SiC and the oxide film through thermal diffusion, to form the interfacial region 40. After that, the deposited oxide film is removed by etching.

In a case where the termination element is H (hydrogen), D (deuterium), or F (fluorine), for example, a heat treatment is performed in an atmosphere containing H or F, for example, so that the interfacial region 40 is formed.

After the interfacial region 40 is formed, a second heat treatment is preferably performed in an oxygen-containing atmosphere under the condition that the amount of oxidized SiC becomes smaller than 1 nm. The second heat treatment is performed under the condition that the SiC is not actually oxidized. The second heat treatment is preferably performed at a temperature not lower than 300° C. and not higher than 900° C.

Figure 8:
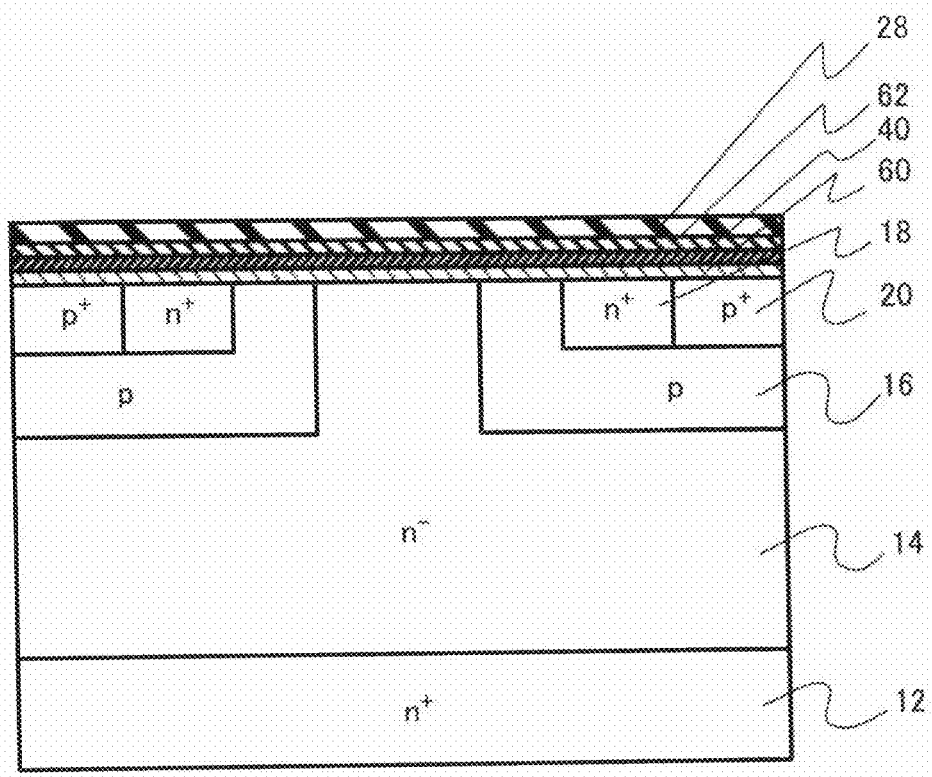
FIG. 8 is a schematic cross-sectional view of the semiconductor device being manufactured by the semiconductor device manufacturing method according to the first embodiment.

The gate insulating film 28 is then deposited on the surface of the thermally-oxidized film 62 above the p-well regions (SiC layers) 16 (FIG. 8). The gate insulating film 28 is a silicon oxide film formed by CVD (Chemical Vapor Deposition), for example.

After the gate insulating film 28 is formed, annealing for densifying the gate insulating film 28 may be performed. The annealing is performed in an inert gas atmosphere such as a nitrogen or argon gas atmosphere, for example.

The gate electrode 30 is then formed on the gate insulating film 28 by a known technique. The gate electrode 30 is doped polysilicon formed by LPCVD, for example.

After that, the interlayer insulating film 32, the source electrode 34, and the drain electrode 36 are formed by a known process, and the MISFET 100 of this embodiment shown in FIG. 1 is completed.

It should be noted that the gate insulating film 28 in FIG. 1 includes the thermally-oxidized film 62.

In the description below, the functions and the effects of the semiconductor device and the semiconductor device manufacturing method according to this embodiment are described.

Figure 9A:
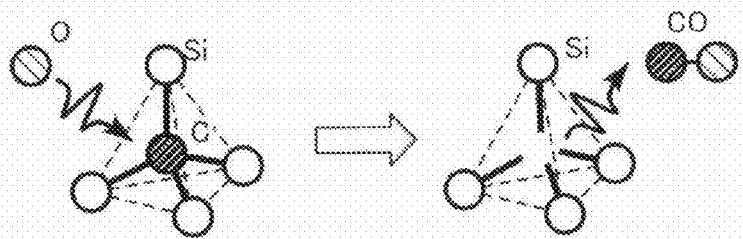
FIGS. 9A, 9B, and 9C are diagrams for explaining a function of the semiconductor device and the semiconductor device manufacturing method according to the first embodiment.
Figure 9B:
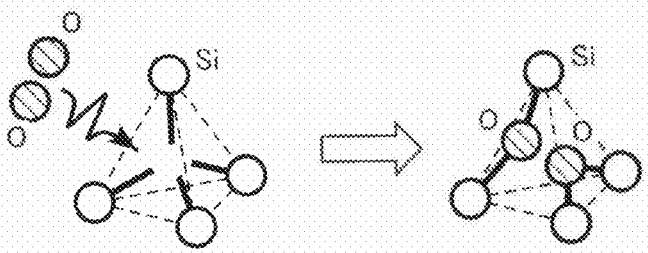
Figure 9C:
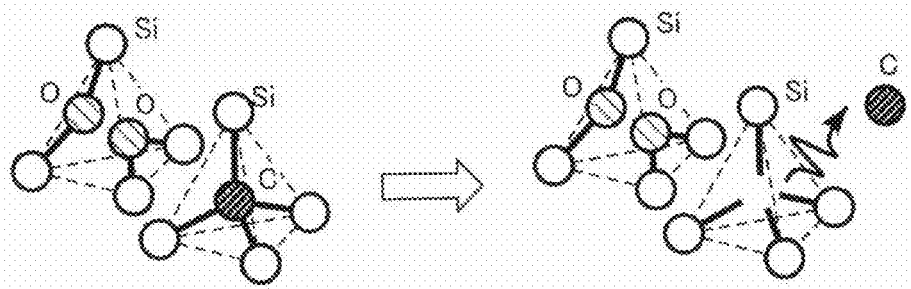

FIGS. 9A through 9C are diagrams for explaining a function of the semiconductor device and the semiconductor device manufacturing method according to this embodiment. These diagrams show mechanisms for forming a carbon vacancy based on the first-principle calculation in a case where SiC is oxidized.

When oxygen (O) is supplied from a SiC surface into SiC, the oxygen binds to carbon (C) in the SiC lattice, and carbon monoxide (CO) is generated. As a result, a carbon vacancy is formed (FIG. 9A). This carbon vacancy forming mechanism is referred to as a first carbon vacancy forming mode.

Through the first-principle calculation, it has become apparent that, in a case where a carbon vacancy and two oxygen atoms coexist, a structure in which the carbon vacancy is substituted by the two oxygen atoms becomes stable in terms of energy (FIG. 9B). Si—O—Si bonds are formed in the SiC lattice. As the carbon vacancy is substituted by the two oxygen atoms, a large energy gain of 8.2 eV is obtained.

The structure shown in FIG. 9B is stable in terms of energy. However, if the SiC oxidation progresses at a high temperature, the structure having the two oxygen atoms in the SiC causes strain in the surrounding area due to its large volume. So as to remove the strain, the carbon in a SiC lattice is released to a space between the lattices, and becomes interstitial carbon. As a result, a carbon vacancy is formed (FIG. 9C). This carbon vacancy forming mechanism is referred to as a second carbon vacancy forming mode.

It has become apparent that, in a case where an oxide film is formed through SiC oxidation, a carbon vacancy can be formed in SiC immediately below the oxide film through the two modes; the first carbon vacancy forming mode and the second carbon vacancy forming mode.

Figure 10A:
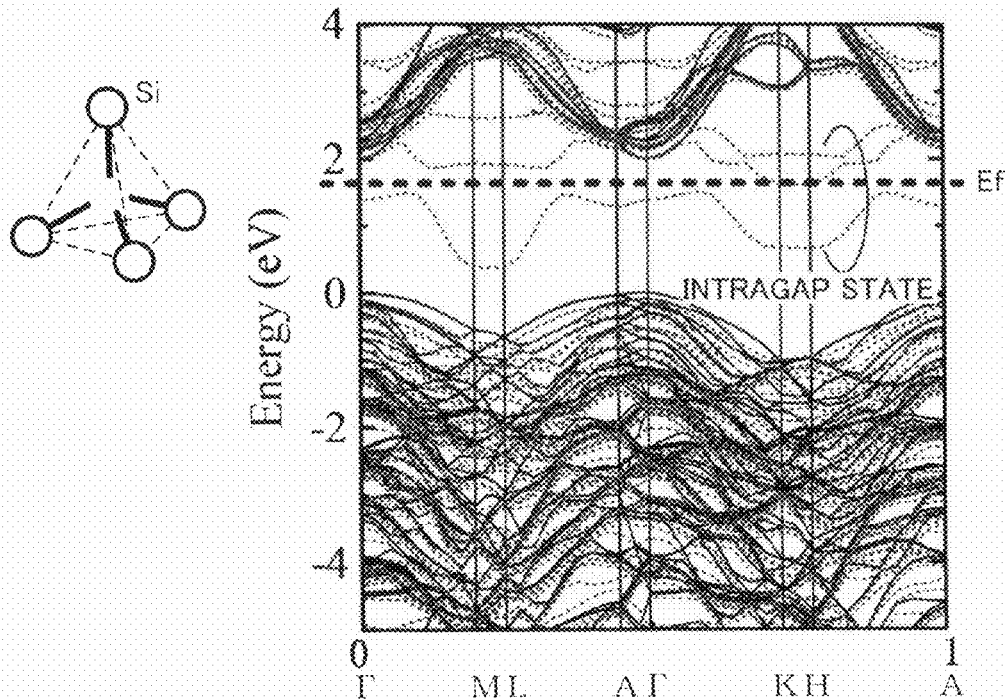
FIGS. 10A and 10B are diagrams for explaining another function of the semiconductor device and the semiconductor device manufacturing method according to the first embodiment.
Figure 10B:
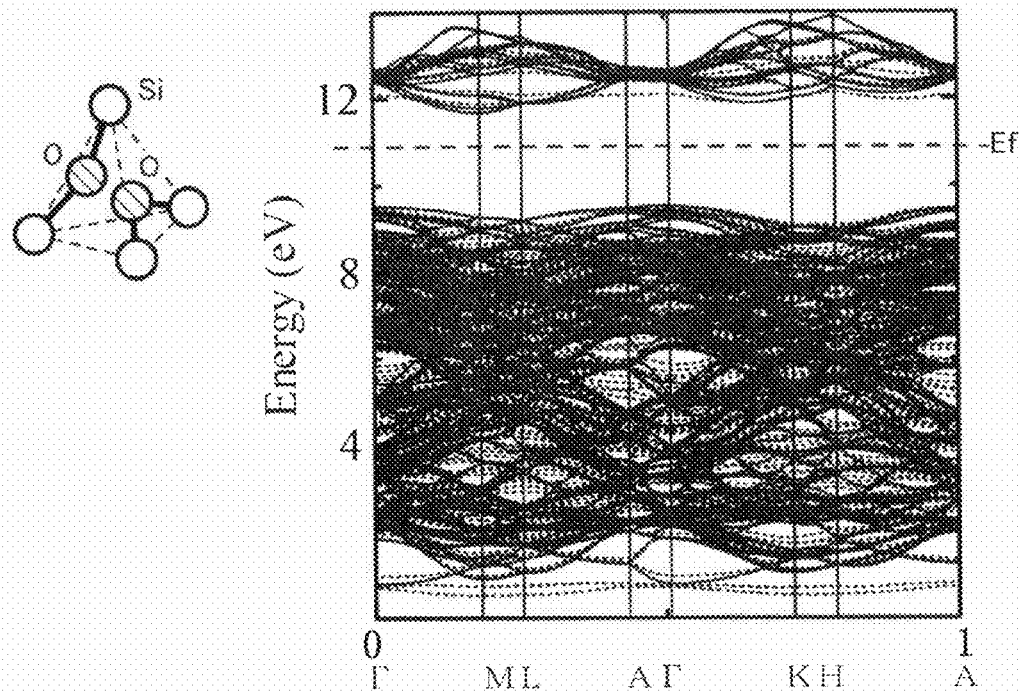

FIGS. 10A and 10B are diagrams for explaining another function of the semiconductor device and the semiconductor device manufacturing method according to this embodiment. FIG. 10A is a band diagram showing a case where a carbon vacancy exists in a SiC lattice. FIG. 10B is a band diagram showing a case where a carbon atom in a SiC lattice is substituted by two oxygen atoms.

As shown in FIG. 10A, in a case where there are carbon vacancies, intragap states are formed in the band gap. As the intragap states interact with each other, localized states are formed at the lower end of the conduction band of the band gap and at the upper end of the valence band.

As shown in FIG. 10B, in a case where a carbon atom in a SiC lattice is substituted by two oxygen atoms, the intragap states disappear. Therefore, any localized state is not formed in the band gap.

If carbon vacancies exist in a channel region of a MISFET, localized levels at the lower end side of the conduction band particularly function as traps for electrons. It is considered that, due to the above phenomenon, the electron mobility becomes lower.

Carbon vacancies in channel regions of a MISFET are formed through epitaxial growth of SiC, ion implantation into SiC, oxidation of SiC, or the like.

In the MISFET 100 according to this embodiment, the oxygen region 60 is provided on the portions of the p-well regions 16 located adjacent to and immediately below the gate insulating film 28. In other words, the oxygen region 60 is provided on the portions of the SiC layers to serve as channel regions.

In the oxygen region 60, a carbon vacancy is substituted by two atoms, so that the carbon vacancy density is lowered. Thus, the decrease in electron mobility is reduced, and the MISFET 100 with a high mobility is realized.

Functioning as a channel region in which carriers move, the oxygen region 60 preferably exists in a shallow region located immediately below the gate insulating film 28. In view of this, the distance (d in FIG. 3) between the boundary between the interfacial region 40 and the oxygen region 60, and the peak position of the element concentration in the interfacial region 40 is preferably 5 nm or shorter. The distance to the peak position of the element concentration in the interfacial region 40 can be measured with an AFM (Atomic Force Microscope), for example. Termination element distribution and the oxygen distribution can also be specifically measured with an atom probe.

The oxygen concentration in the oxygen region 60 is preferably not lower than $1\times10^{16}$ cm$^{-3}$ and not higher than $1\times10^{21}$ cm$^{-3}$. If the oxygen concentration is below the above range, there is a possibility that the mobility decrease cannot be sufficiently suppressed. If the oxygen concentration exceeds the above range, strain of the SiC becomes larger, the carbon vacancy density becomes higher, and there is a possibility that the mobility decrease cannot be sufficiently suppressed. More preferably, the oxygen concentration in the oxygen region 60 is not lower than $1\times10^{17}$ cm$^{-3}$ and not higher than $1\times10^{20}$ cm$^{-3}$. When the channel formation method is optimized, the concentration of the resultant carbon defects formed in the channel can be adjusted to a value not lower than $5\times10^{16}$ cm$^{-3}$ and not higher than $5\times10^{20}$ cm$^{-3}$. The optimum concentration is achieved when two oxygen atoms are introduced into each of the resultant carbon defects formed in the channel. As for the lower limit, an effect can be expected when 10% of the lower limit of the carbon defect amount is achieved. Therefore, the lower limit of the oxygen concentration is $1\times10^{16}$ cm$^{-3}$ or higher, and ideally, $1\times10^{17}$ cm$^{-3}$ or higher. As for the upper limit, an effect can be expected when 10% of the upper limit of the carbon defect amount is achieved. Therefore, $1 \times 10^{20}$ cm$^{-3}$ or lower is effective as the upper limit of the oxygen concentration. Further, it is possible to consider the upper limit of the oxygen concentration to be $1 \times 10^{21}$ cm$^{-3}$, which is the value obtained in a case where two oxygen atoms are introduced into each one of the carbon defects that have reached the maximum concentration. The oxygen concentration in the oxygen region 60 can be measured by SIMS (Secondary Ion Mass Spectrometry), for example.

The oxygen region 60 preferably contains Si—O—Si bonds. Whether a bond is a Si—O—Si bond can be determined by XPS (X-ray Photoelectron Spectroscopy) or with a FT-IR (Fourier Transform Infrared) spectrometer.

Also, carbon atoms in SiC lattices are preferably substituted by oxygen atoms in the oxygen region 60. Whether carbon atoms in SiC lattices are substituted by oxygen atoms in the oxygen region 60 can be determined by XPS or with a FT-IR spectrometer.

Further, in the MISFET 100 according to this embodiment, dangling bonds are terminated with the termination element in the interfacial region 40, and the dangling bond density is lowered therein. Thus, the decrease in electron mobility is reduced, and the MISFET 100 with a high mobility is realized.

The thickness of the interfacial region 40 is preferably 5 nm or smaller. The thickness of the interfacial region 40 is more preferably 3 nm or smaller, and even more preferably, 1 nm or smaller. Termination occurs when the element in the outermost surface of the SiC substrate is substituted or adsorbs to the dangling bonds. Therefore, the ultimately preferable thickness of the interfacial region 40 is 0.25 nm or smaller. The thickness of the interfacial region 40 is defined by the full width at half maximum of the peak indicated by the distribution of the concentration of the termination element. The thickness of the interfacial region 40 can be measured with an AFM, for example. A termination element distribution can be measured with an atom probe.

The peak concentration in the termination element in the interfacial region 40 is preferably not lower than $1 \times 10^{18}$ cm$^{-3}$ and not higher than $1 \times 10^{23}$ cm$^{-3}$. More preferably, the peak concentration in the termination element in the interfacial region 40 is not lower than $1 \times 10^{21}$ cm$^{-3}$ and not higher than $5 \times 10^{22}$ cm$^{-3}$. The area density of the termination element in the interfacial region 40 is preferably not lower than $1 \times 10^{12}$ cm$^{-2}$ and not higher than $2.5 \times 10^{15}$ cm$^{-2}$, and more preferably, not lower than $1 \times 10^{14}$ cm$^{-2}$ and not higher than $1.3 \times 10^{15}$ cm$^{-2}$. The peak concentration of the termination element in the interfacial region 40 can be measured by SIMS, for example.

The termination element in the interfacial region 40 is preferably N (nitrogen), P (phosphorus), As (arsenic), or Sb (antimony), which has a highly stable termination structure. Particularly, N is preferable in the C face, at least one of P, As, and Sb is preferable in the Si face, and a combination of N and at least one of P, As, and Sb is preferable in the A face and the M face.

By the method of manufacturing the MISFET 100 according to this embodiment, the oxygen region 60 is formed in an oxygen-containing atmosphere under a condition that SiC oxidation does not actually progress. That is, the first heat treatment is performed under the condition that the amount of oxidized SiC is smaller than 1 nm. For example, the heat treatment is performed at a low temperature not lower than 300° C. and not higher than 900° C.

As the heat treatment is performed in an oxygen-containing atmosphere under the condition that SiC oxidation does not actually progress, excessive supply of oxygen into SiC is restrained. Accordingly, carbon vacancy formation through the above described first and second carbon vacancy forming modes is restrained. With an appropriate supply of oxygen, each carbon vacancy in the SiC is substituted by two oxygen atoms, and the carbon vacancies in the SiC are reduced.

In a case where the MIS structure is formed on the carbon face in which the oxidation rate is higher than that in the silicon face, the first and second heat treatments are preferably performed at a temperature not lower than 300° C. and not higher than 800° C. The oxidation rate in the A face and the M face is between that in the silicon face and that in the carbon face. Accordingly, the first and second heat treatments are preferably performed at a temperature not lower than 300° C. and not higher than 850° C.

By the method of manufacturing the MISFET 100 according to this embodiment, the oxygen region 60 is formed prior to formation of the interfacial region 40. Therefore, at the time of the formation of the interfacial region 40, the carbon vacancies immediately below the SiC surface have been substituted by oxygen and disappeared. Accordingly, a termination element of a type that substitutes for the carbon in SiC is prevented from diffusing in the SiC.

For example, an element such as N (nitrogen), P (phosphorus), As (arsenic), or Sb (antimony) substitutes for the carbon in SiC and serves as a donor. This causes fluctuation in the threshold voltage of the MISFET. By the manufacturing method according to this embodiment, the termination element serving as a donor is prevented from diffusing into channel regions, and a MISFET with a stable threshold voltage is realized.

After the interfacial region 40 is formed, the second heat treatment is preferably further performed in an oxygen-containing atmosphere under the condition that SiC oxidation does not actually progress. Through the second heat treatment, the carbon vacancies that have appeared due to the heat treatment and the ion implantation for forming the interfacial region 40 can be eliminated.

Also, in this embodiment, the gate insulating film 28 is formed mainly with a deposited film. Accordingly, the formation of carbon vacancies in the first and second carbon vacancy forming modes is restrained more efficiently than in a case where the gate insulating film 28 is formed through thermal oxidation. As a result, the carbon concentration in the gate insulating film 28 is lowered. Thus, the leakage characteristics and the reliability of the gate insulating film 28 are improved.

In this embodiment, the thin thermally-oxidized film 62 is formed prior to the formation of the oxygen region 60 and the interfacial region 40. Accordingly, the oxygen region 60 and the interfacial region 40 can be formed in a stable manner.

As described so far, this embodiment realizes a MISFET having a high mobility. Accordingly, a MISFET with a low on-state resistance and low loss is realized. Also, a MISFET with a stable threshold voltage is realized.

Second Embodiment

A semiconductor device manufacturing method according to this embodiment is the same as the method according to the first embodiment, except that the thermally-oxidized film having a thickness of 5 nm or smaller is not formed on the surfaces of the SiC layers before the oxygen region is formed. Therefore, the same explanations as those in the first embodiment will not be repeated.

In this embodiment, p-type p-well regions 16, n⁺-type source regions 18, and p'-type p-well contact regions 20 are formed (FIG. 4), as in the first embodiment.

In an oxygen-containing atmosphere, a first heat treatment is performed under the condition that the amount of oxidized SiC becomes smaller than 1 nm, so that an oxygen region 60 is formed on the surfaces of the p-well regions 16, the source regions 18, and the p-well contact regions 20. Thereafter, a MISFET is manufactured in the same manner as in the first embodiment.

This embodiment realizes a MISFET having a high mobility. Accordingly, a MISFET with a low on-state resistance and low loss is realized. Also, a MISFET can be manufactured through a simpler process than that in the first embodiment.

Third Embodiment

A semiconductor device manufacturing method according to this embodiment includes: forming a gate insulating film by thermally oxidizing a SiC layer; forming an oxygen region containing oxygen, after the formation of the gate insulating film, on the SiC layer by performing a first heat treatment in an oxygen-containing atmosphere under the condition that the amount of oxidized SiC is smaller than 1 nm; forming an interfacial region on the surface of the oxygen region after the formation of the oxygen region, the interfacial region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine); and forming a gate electrode on the gate insulating film. This method is the same as the method according to the first embodiment, except that the gate insulating film is formed through thermal oxidation prior to the formation of the oxygen region. Therefore, the same explanations as those in the first embodiment will not be repeated.

In this embodiment, p-type p-well regions 16, n⁺-type source regions 18, and p⁺-type p-well contact regions 20 are formed (FIG. 4), as in the first embodiment.

Figure 11:
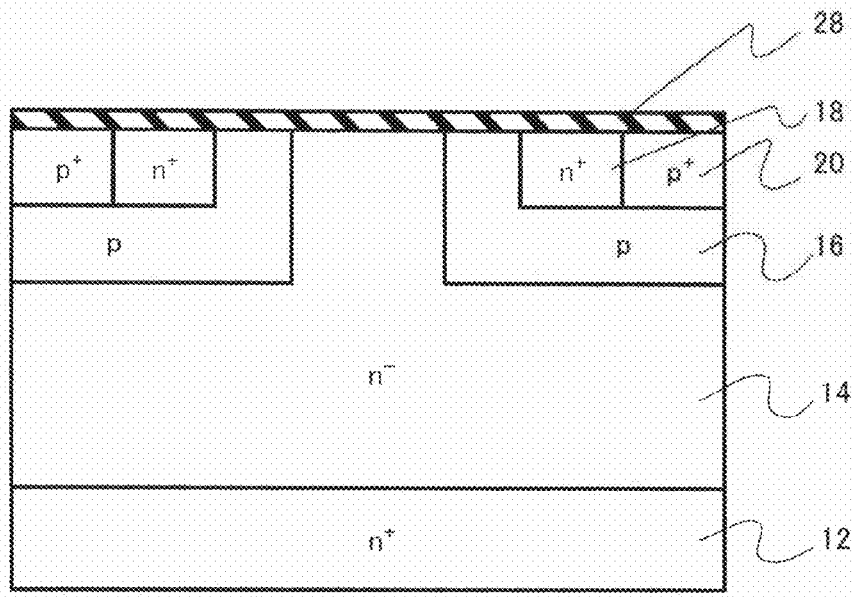
FIG. 11 is a schematic cross-sectional view showing the semiconductor device being manufactured by a semiconductor device manufacturing method according to a third embodiment.

A gate insulating film 28 is then formed by thermally oxidizing the p-well regions (SiC layers) 16, a drift layer 14, the source regions 18, and the p-well contact regions 20 (FIG. 11). The thermal oxidation is performed at a temperature not lower than 1200° C. and not higher than 1400° C., and more preferably, at a temperature not lower than 1250° C. and not higher than 1350° C.

Figure 12:
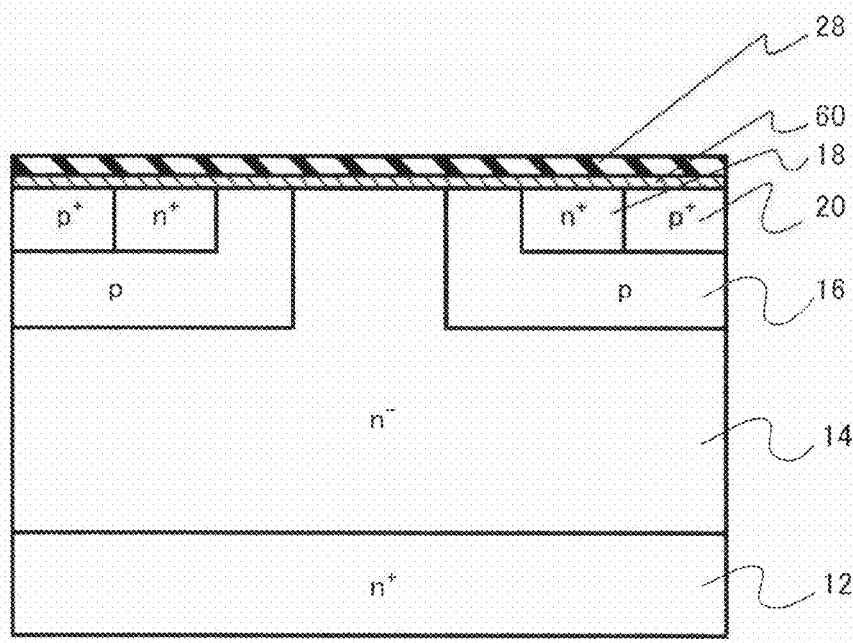
FIG. 12 is a schematic cross-sectional view showing the semiconductor device being manufactured by the semiconductor device manufacturing method according to the third embodiment.

In an oxygen-containing atmosphere, a first heat treatment is performed under the condition that the amount of oxidized SiC becomes smaller than 1 nm, so that an oxygen region 60 is formed on the surfaces of the p-well regions 16, the source regions 18, and the p-well contact regions 20 (FIG. 12).

Figure 13:
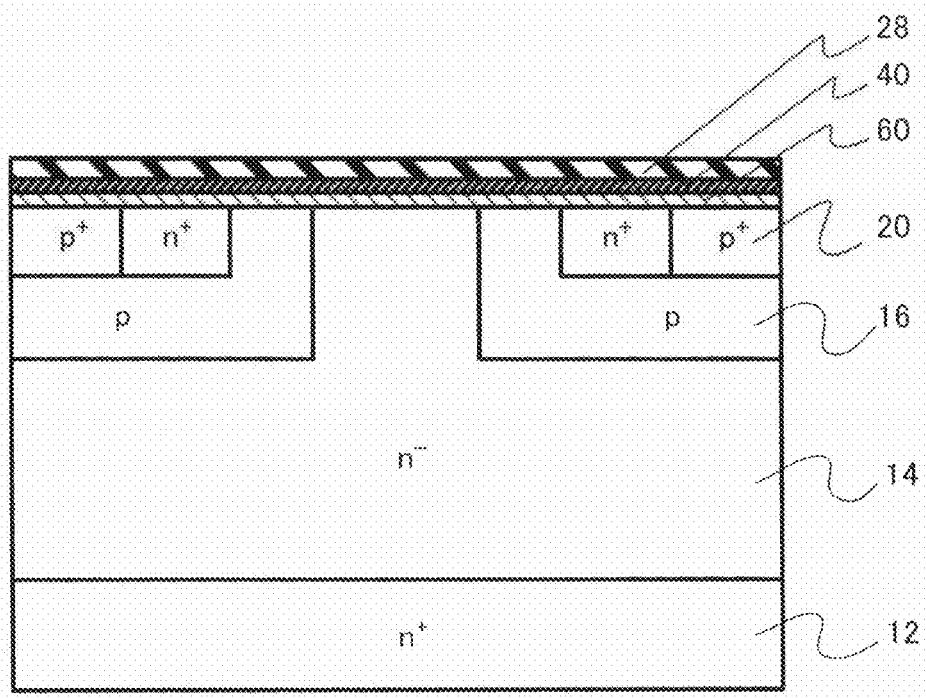
FIG. 13 is a schematic cross-sectional view showing the semiconductor device being manufactured by the semiconductor device manufacturing method according to the third embodiment.

After the oxygen region 60 is formed, an interfacial region 40 containing at least one termination element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine) is formed on the surface of the oxygen region 60 (FIG. 13). The interfacial region 40 is formed between the oxygen region 60 and the gate insulating film 28.

Thereafter, a MISFET is manufactured in the same manner as in the first embodiment.

This embodiment realizes a MISFET having a high mobility. Accordingly, a MISFET with a low on-state resistance and low loss is realized. Also, a MISFET can be manufactured through a simpler process than that in the first embodiment.

Fourth Embodiment

A semiconductor device according to this embodiment is the same as that of the first embodiment, except for being a MISFET of a trench gate type. Therefore, the same explanations as those in the first embodiment will not be repeated.

Figure 14:
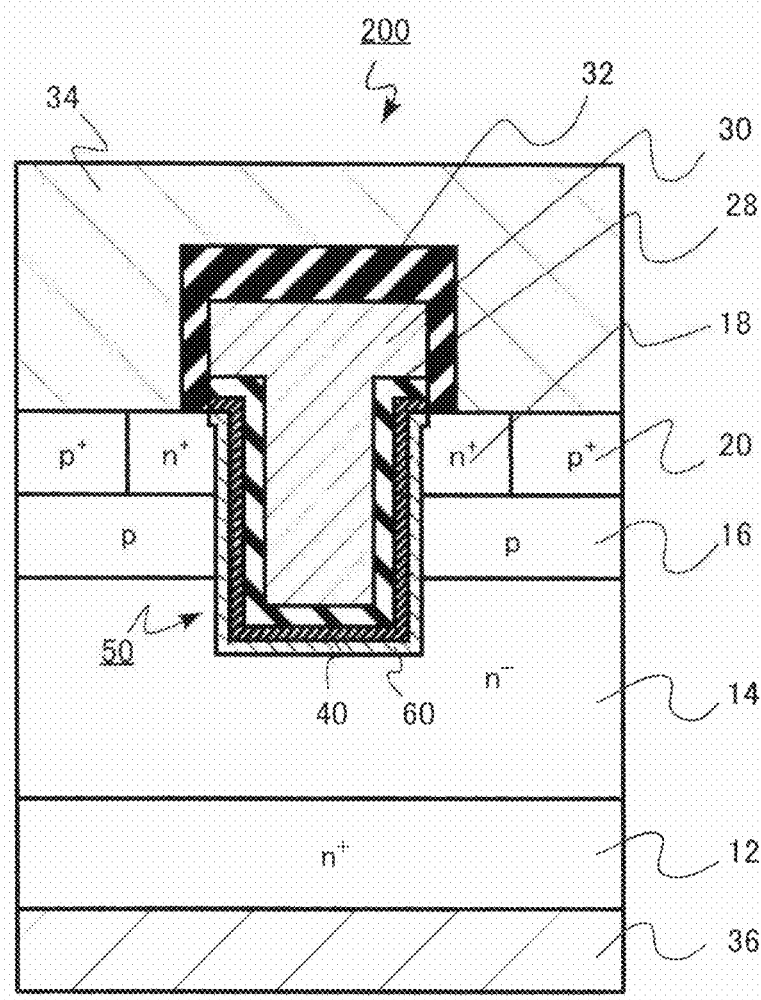
FIG. 14 is a schematic cross-sectional view of a semiconductor device according to a fourth embodiment.

FIG. 14 is a schematic cross-sectional view showing the structure of a MISFET that is the semiconductor device according to this embodiment. This MISFET 200 is a trench-gate MISFET having a gate insulating film and a gate electrode provided in a trench.

This MISFET 200 includes an n⁺-type SiC substrate 12 having first and second planes. In FIG. 14, the first plane is the upper surface, and the second plane is the lower surface.

This SiC substrate 12 is a 4H-SiC SiC substrate containing N (nitrogen), for example, as the n-type impurity at an impurity concentration not lower than $1\times10^{10}$ cm$^{-3}$ and not higher than $1\times10^{20}$ cm$^{-3}$, for example.

An n⁻-type SiC layer (drift layer) 14 containing the n-type impurity at an impurity concentration not lower than $5\times10^{15}$ cm$^{-3}$ and not higher than $2\times10^{16}$ cm$^{-3}$, for example, is formed on the first plane of the SiC substrate 12. The drift layer 14 is an epitaxially grown layer formed on the SiC substrate 12 by epitaxial growth, for example.

The surface of the drift layer 14 is also a plane tilted zero to eight degrees with respect to the silicon face. The thickness of the drift layer 14 is not smaller than 5 µm and not greater than 150 µm, for example.

P-type p-well regions (SiC layers) 16 containing the p-type impurity at an impurity concentration not lower than $5\times10^{15}$ cm$^{-3}$ and not higher than $1\times10^{17}$ cm$^{-3}$, for example, are formed in part of the surface of the drift layer 14. The depth of the p-well regions 16 is approximately 0.6 µm, for example. The p-well regions 16 function as channel regions of the MISFET 200.

N⁺-type source regions 18 containing the n-type impurity at an impurity concentration not lower than approximately $1\times10^{18}$ cm$^{-3}$ and not higher than approximately $1\times10^{22}$ cm$^{-3}$, for example, are formed in part of the surfaces of the p-well regions 16. The depth of the source regions 18 is smaller than the depth of the p-well regions 16, and is approximately 0.3 µm, for example.

P⁺-type p-well contact regions 20 containing the p-type impurity at an impurity concentration not lower than $1\times10^{18}$ cm$^{-3}$ and not higher than $1\times10^{22}$ cm$^{-3}$, for example, are formed in part of the surfaces of the p-well regions 16 and on the sides of the source regions 18. The depth of the p-well contact regions 20 is smaller than the depth of the p-well regions 16, and is approximately 0.3 µm, for example.

A trench 50 is formed in the direction from the surface of the drift layer 14 toward the SiC substrate 12. The inner wall surface of the trench 50 is an M face or an A face, for example.

A gate insulating film 28 is continuously formed on the surfaces of the drift layer 14, the p-well regions 16, and the source regions 18 in the trench 50, so as to bridge the layer and the regions.

A gate electrode 30 is formed on the gate insulating film 28. The p-well regions 16 interposed between the drift layer 14 and the source regions 18 on side surfaces of the trench 50 function as channel regions of the MISFET 200.

The gate insulating film 28 is provided between the gate electrode 30 and the p-well regions 16. An interfacial region 40 is provided between the gate insulating film 28 and the p-well regions 16.

The interfacial region 40 contains at least one element (termination element) selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine).

An oxygen region 60 is provided between the interfacial region 40 and the p-well regions 16. The oxygen region 60 has a higher oxygen concentration than the concentration of the termination element.

The MISFET 200 includes a conductive source electrode 34 electrically connected to the source regions 18 and the p-well contact regions 20. The source electrode 34 also functions as a p-well electrode to apply potential to the p-well regions 16. A conductive drain electrode 36 is formed on the opposite side of the SiC substrate 12 from the drift layer 14, or on the second plane side of the SiC substrate 12.

According to this embodiment, the same effects as those of the first embodiment can be achieved, as the oxygen region 60 and the interfacial region 40 are provided. Further, the degree of integration of the MISFET can be increased as a trench gate structure is employed, and conduction loss can be reduced as any JFET region is not included.

Fifth Embodiment

A semiconductor device according to this embodiment is the same as that of the first embodiment, except for being not a MISFET but an IGBT. Therefore, the same explanations as those in the first embodiment will not be repeated.

Figure 15:
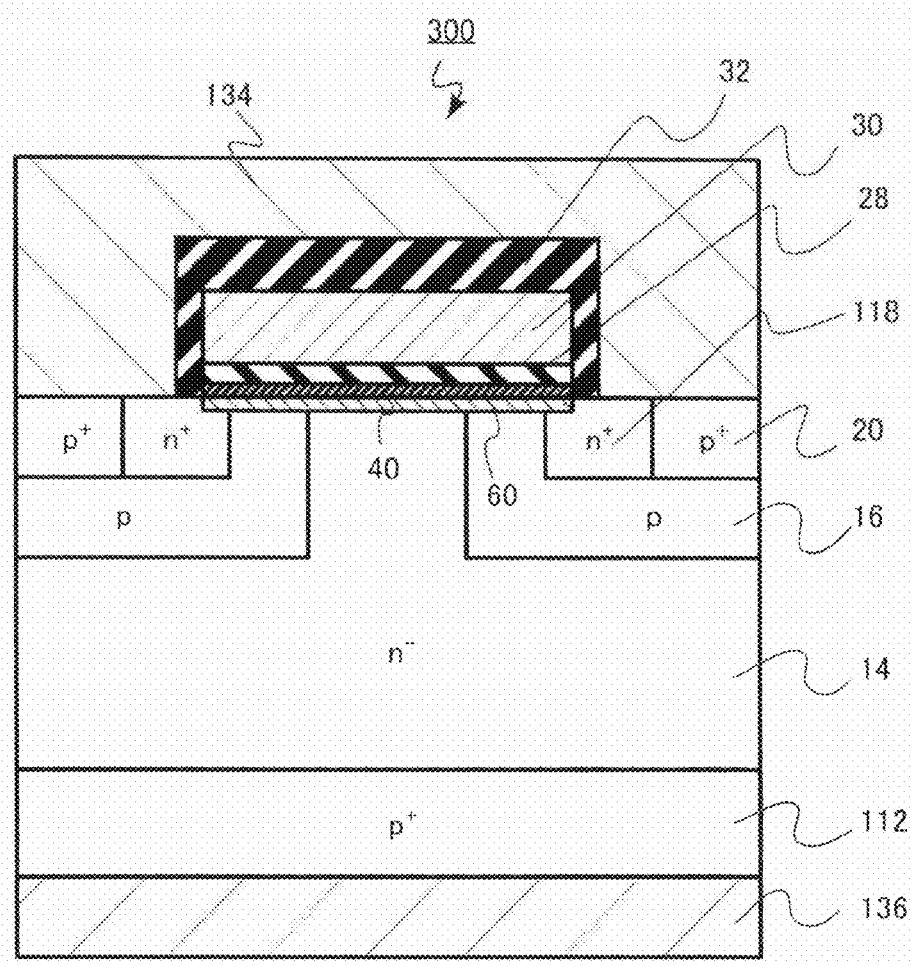
FIG. 15 is a schematic cross-sectional view of a semiconductor device according to a fifth embodiment.

FIG. 15 is a schematic cross-sectional view showing the structure of an IGBT that is the semiconductor device according to this embodiment.

This IGBT 300 includes a p$^+$-type SiC substrate 112 having first and second planes. In FIG. 15, the first plane is the upper surface, and the second plane is the lower surface.

This SiC substrate 112 is a 4H-SiC SiC substrate containing Al (aluminum), for example, as the p-type impurity at an impurity concentration not lower than $1\times10^{18}$ cm$^{-3}$ and not higher than $1\times10^{20}$ cm$^{-3}$, for example.

The description below concerns an example case where the first plane of the SiC substrate 112 is a plane tilted zero to eight degrees with respect to the silicon face, and the second plane is a plane tilted zero to eight degrees with respect to the carbon face. The plane tilted zero to eight degrees with respect to the silicon face, and the plane tilted zero to eight degrees with respect to the carbon face can be regarded substantially equivalent to the silicon face and the carbon face, respectively, in terms of characteristics.

An n$^-$-type SiC layer (drift layer) 14 containing the n-type impurity at an impurity concentration not lower than $5\times10^{15}$ cm$^{-3}$ and not higher than $2\times10^{16}$ cm$^{-3}$, for example, is formed on the first plane of the SiC substrate 112. The drift layer 14 is an epitaxially grown layer formed on the SiC substrate 112 by epitaxial growth, for example.

The surface of the drift layer 14 is also a plane tilted zero to eight degrees with respect to the silicon face. The thickness of the drift layer 14 is not smaller than 5 μm and not greater than 150 μm, for example.

P-type p-well regions (SiC layers) 16 containing the p-type impurity at an impurity concentration not lower than $5\times10^{15}$ cm$^{-3}$ and not higher than $1\times10^{17}$ cm$^{-3}$, for example, are formed in part of the surface of the drift layer 14. The depth of the p-well regions 16 is approximately 0.6 μm, for example. The p-well regions 16 function as channel regions of the IGBT 300.

N$^+$-type emitter regions 118 containing the n-type impurity at an impurity concentration not lower than approximately $1\times10^{18}$ cm$^{-3}$ and not higher than approximately $1\times10^{22}$ cm$^{-3}$, for example, are formed in part of the surfaces of the p-well regions 16. The depth of the emitter regions 118 is smaller than the depth of the p-well regions 16, and is approximately 0.3 μm, for example.

P$^+$-type p-well contact regions 20 containing the p-type impurity at an impurity concentration not lower than $1\times10^{18}$ cm$^{-3}$ and not higher than $1\times10^{22}$ cm$^{-3}$, for example, are formed on part of the surfaces of the p-well regions 16 and on the sides of the emitter regions 118. The depth of the p-well contact regions 20 is smaller than the depth of the p-well regions 16, and is approximately 0.3 μm, for example.

A gate insulating film 28 is continuously formed on the surfaces of the drift layer 14 and the p-well regions 16, so as to bridge the layer and the regions. The gate insulating film 28 may be a silicon oxide film or a high-k insulating film, for example. So as to reduce current leakage from the gate insulating film 28, it is preferable to provide a silicon oxide film having a wider band gap than a high-k insulating film.

A gate electrode 30 is formed on the gate insulating film 28. The gate electrode 30 may be made of polysilicon, for example. An interlayer insulating film 32 formed with a silicon oxide film, for example, is formed on the gate electrode 30.

The p-well regions 16 interposed between the drift layer 14 and the emitter regions 118 located below the gate electrode 30 function as channel regions of the IGBT 300.

The gate insulating film 28 is provided between the gate electrode 30 and the p-well regions 16. An interfacial region 40 is provided between the gate insulating film 28 and the p-well regions 16.

The interfacial region 40 contains at least one element (termination element) selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine).

An oxygen region 60 is provided between the interfacial region 40 and the p-well regions 16. The oxygen region 60 has a higher oxygen concentration than the concentration of the termination element.

The IGBT 300 includes a conductive emitter electrode 134 electrically connected to the emitter regions 118 and the p-well contact regions 20. The emitter electrode 134 also functions as a p-well electrode to apply potential to the p-well regions 16.

The emitter electrode 134 is formed with a Ni (nickel) barrier metal layer and an Al (aluminum) metal layer stacked on the barrier metal layer, for example. The Ni barrier metal layer and the Al metal layer may form an alloy through a reaction.

A conductive collector electrode 136 is formed on the opposite side of the SiC substrate 112 from the drift layer 14, or on the second plane side of the SiC substrate 112. The collector electrode 136 is formed with a Ni (nickel) barrier metal layer and an Al (aluminum) metal layer stacked on the barrier metal layer, for example. The Ni barrier metal layer and the Al metal layer may form an alloy through a reaction.

In this embodiment, the n-type impurity is preferably N (nitrogen) or P (phosphorus), for example, but it is also possible to use As (arsenic), Sb (antimony), or the like. The p-type impurity is preferably Al (aluminum), for example, but it is also possible to use B (boron), Ga (gallium), In (indium), or the like.

According to this embodiment, the same functions and effects as those of the first embodiment can be achieved, as the oxygen region 60 and the interfacial region 40 are provided. Accordingly, an IGBT with a low on-state resistance and low loss is realized. Also, an IGBT with a stable threshold voltage is realized.

Although silicon carbide crystalline structures are 4H-SiC in the above described embodiments, these embodiments can also be applied to silicon carbides having other crystalline structures such as 6H-SiC and 3C-SiC.

Although examples of MIS structures having electrons as carriers have been described in the above embodiments, these embodiments can also be applied to MIS structures having n-type SiC layers as channel regions and holes as carriers.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a SiC layer;
   a gate electrode;
   a gate insulating film provided between the SiC layer and the gate electrode;
   a first region provided between the SiC layer and the gate insulating film, the first region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine); and
   a second region being an uppermost part of the SiC layer, being not thermally oxidized SiC, and being provided adjacent to the first region, an oxygen concentration in the second region being higher than a concentration of the at least one element in the second region.

2. The device according to claim 1, wherein the SiC layer is of a p-type.

3. The device according to claim 1, wherein a distance between a boundary between the first region and the second region, and a peak position of the concentration of the at least one element in the first region is 5 nm or shorter.

4. The device according to claim 1, wherein the oxygen concentration in the second region is not lower than $1 \times 10^{16}$ cm$^{-3}$ and not higher than $1 \times 10^{21}$ cm$^{-3}$.

5. The device according to claim 1, wherein a Si—O—Si bond exists in the second region.

6. The device according to claim 1, wherein carbon site in a SiC lattice is occupied by oxygen in the second region.

7. The device according to claim 1, wherein a peak concentration of the at least one element in the first region is not lower than $1 \times 10^{18}$ cm$^{-3}$ and not higher than $1 \times 10^{23}$ cm$^{-3}$.

8. The device according to claim 1, wherein the gate insulating film is a silicon oxide film.

9. The device according to claim 1, wherein the second region includes a pair of oxygen atoms occupying a carbon site of SiC lattice.

10. A semiconductor device comprising:
    a SiC layer;
    a gate electrode;
    a gate insulating film provided between the SiC layer and the gate electrode;
    a first region provided between the SiC layer and the gate insulating film, the first region containing at least one element selected from the group consisting of N (nitrogen), P (phosphorus), As (arsenic), Sb (antimony), Sc (scandium), Y (yttrium), La (lanthanum), lanthanoids (Ce, Pr, Nd, Pm, Sm, Eu, Gd, Tb, Dy, Ho, Er, Tm, Yb, and Lu), H (hydrogen), D (deuterium), and F (fluorine), and
    a second region being a part of the SiC layer, being single crystal SiC, being a conductive channel forming region, and being provided adjacent to the first region, an oxygen concentration in the second region being higher than a concentration of the at least one element in the second region.

11. The device according to claim 10, wherein the SiC layer is of a p-type.

12. The device according to claim 10, wherein a distance between a boundary between the first region and the second region, and a peak position of the concentration of the at least one element in the first region is 5 nm or shorter.

13. The device according to claim 10, wherein the oxygen concentration in the second region is not lower than $1 \times 10^{16}$ cm$^{-3}$ and not higher than $1 \times 10^{21}$ cm$^{-3}$.

14. The device according to claim 10, wherein a Si—O—Si bond exists in the second region.

15. The device according to claim 10, wherein carbon site in a SiC lattice is occupied by oxygen in the second region.

16. The device according to claim 10, wherein a peak concentration of the at least one element in the first region is not lower than $1 \times 10^{18}$ cm$^{-3}$ and not higher than $1 \times 10^{23}$ cm$^{-3}$.

17. The device according to claim 10, wherein the gate insulating film is a silicon oxide film.

18. The device according to claim 10, wherein the second region includes a pair of oxygen atoms occupying a carbon site of the SiC lattice.

19. The device according to claim 10, wherein the second region includes a pair of oxygen atoms occupying a carbon site of SiC lattice.

* * * * *